United States Patent [19]
Ishigaki et al.

[11] 4,066,972
[45] Jan. 3, 1978

[54] SYSTEM FOR DEMODULATING ANGLE-MODULATED SIGNALS

[75] Inventors: Yukinobu Ishigaki, Yamato; Kohei Sasamura, Sagamihara, both of Japan

[73] Assignee: Victor Company of Japan, Ltd., Yokohama, Japan

[21] Appl. No.: 712,707

[22] Filed: Aug. 9, 1976

[30] Foreign Application Priority Data

Aug. 15, 1975 Japan ............................. 50-98498
Aug. 15, 1975 Japan ............................. 50-98499

[51] Int. Cl.² .......................................... H03D 3/22
[52] U.S. Cl. ................................. 329/134; 325/349; 329/136; 329/137
[58] Field of Search ............... 329/110, 131, 134, 136, 329/137, 145; 325/349

[56] References Cited
U.S. PATENT DOCUMENTS

| | | | |
|---|---|---|---|
| 2,835,802 | 5/1958 | Day | 325/349 X |
| 3,387,220 | 6/1968 | Lender | 329/145 X |
| 3,392,337 | 7/1968 | Neuburger | 329/110 X |
| 3,569,845 | 3/1971 | Steinberg | 329/131 X |
| 3,792,357 | 2/1974 | Hekimian et al. | 325/349 X |

*Primary Examiner*—Siegfried H. Grimm

[57] ABSTRACT

The inventive system demodulates angle-modulated signals. A tracking band-pass filter responds to an input angle-modulated wave signal. The tracking filter has a pass band with a center frequency controlled by a control signal. A first amplitude limiter limits the amplitude of the input angle-modulated wave signal. A differentiation circuit establishes a 90° phase difference between a signal passing through the tracking band-pass filter and a signal passing through the amplitude limiter. A phase comparator responds to an input with the two signals with a 90° phase difference therebetween and produces an output error signal in accordance with this phase difference. This output error signal is supplied as the control signal to the tracking band-pass filter. This output error signal is also passed through a low pass filter to obtain the demodulated signal.

9 Claims, 11 Drawing Figures

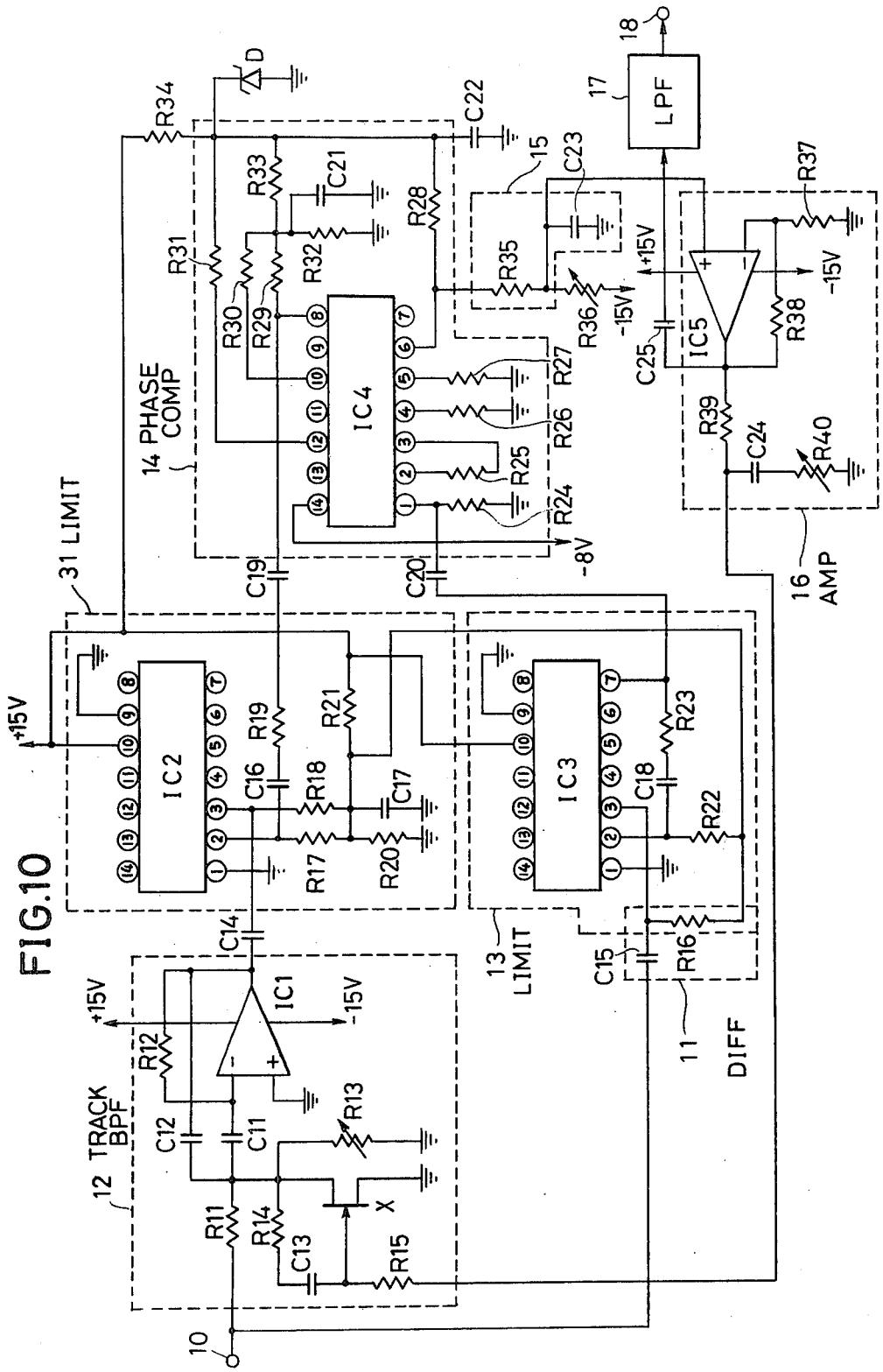

SYSTEM FOR DEMODULATING ANGLE-MODULATED SIGNALS

BACKGROUND OF THE INVENTION

The present invention relates generally to systems for demodulating angle-modulated signals, and more particularly to a system using a tracking loop for demodulating angle-modulated signals, with a large signal to noise ratio.

A system which uses a phase locked loop (hereinafter referred to as "PLL") comprises a phase comparator, a loop filter, a DC amplifier, a voltage-controlled oscillator, and other components. Heretofore, such a system has been used for demodulating angle-modulated wave signals.

In this PLL, if a wide band width of the loop is used, noise will readily impart an effect. However, there is no ready effect from noise, if a narrow band width of the loop is used. The loop band width of a PLL, however, cannot be narrower than a certain degree, since it depends upon factors such as the frequency band width of the angle-modulated wave signal and the modulation signal level. Consequently, if there is a high level of noise within or in the vicinity of the frequency band of the angle-modulated wave signal, the noise will impart an effect. In some cases, the phase locked loop may unlock. In such a case, the loop may lock with the noise component, and normal demodulation becomes impossible, whereby an abnormal noise is generated.

Furthermore, as is known, the input signal frequency versus error signal voltage characteristic of a PLL has a linearly sloped characteristic. The error voltage increases as the frequency increases from a center frequency f0 and decreases as the frequency decreases from this center frequency f0. Thus, as the frequency is gradually elevated from the center frequency f0, the error voltage also increases (with positive polarity) in proportion thereto. However, when the frequency reaches a certain value f1, the error voltage instantaneously becomes zero. As the frequency is gradually lowered from the frequency f1 to a value f2 (f0<f2<f1), the error voltage rises abruptly. The characteristic returns to the original sloped characteristic.

Similarly, when the frequency is gradually lowered from the center frequency f0, the error voltage also decreases (with negative polarity) in proportion thereto. When the frequency reaches a certain value f4, the error voltage instantaneously becomes zero. When the frequency is gradually raised from the value f4 to a value f3 (f4<f3<f0), the error voltage abruptly rises. The characteristic returns to the original sloped characteristic. In this connection, the frequency interval of from f4 to f1 is generally called the "lock range". The frequency range of from f3 to f2 is called the "capture range".

Accordingly, there is no problem whatsoever if the frequency deviation width $\Delta f$ of the PLL input angle-modulated wave signal falls between the frequencies f4 to f1, that is, within the lock range. However, if this frequency deviation width is greater than the lock range, the error voltage abruptly becomes zero when the angle-modulated carrier wave exceeds the lock range. Consequently, large abnormal noises are generated in the demodulation output at this time.

Furthermore, if an analog multiplier is used in the phase comparator of the PLL, the loop gain varies in accordance with the magnitude of the level of the angle-modulated wave signal fed as input into the phase comparator. Then, the lock range also varies.

When an interference arises as a consequence of the angle-modulated wave signal and a noise is introduced from the outside and existing within the band of this angle-modulated wave signal, the level of this signal sometimes drops abruptly or becomes zero. The lock range also drops each time this occurs. As a consequence, an unlocking of the PLL occurs frequently, even when the frequency deviation width $\Delta f$ of the angle-modulated wave signal is small. Abnormal noise and distortion are generated in the demodulated output.

On one hand, discrete 4-channel system record discs have been described by U.S. Pat. Nos. 3,686,471 and 3,883,699 and have been reduced to practice. In a system of this character, two sum and difference signals are obtained by matrixing 4-channel signals. The difference signals are angle modulated. Direct-wave sum signals and angle-modulated wave difference signals are multiplexed and recorded in a single sound groove of the record disc. When this record disc is reproduced (played) by a reproducing stylus, a tracing distortion is produced because the extreme tip of the reproducing stylus has a certain finite radius, as is known. When this tracing distortion is present, the higher harmonic component of the direct-wave signal becomes admixed into the angle-modulated wave band. The PLL then becomes erroneously locked, in some cases, to this higher harmonic component of the direct-wave signal.

Thus, when a multichannel record disc is being reproduced and a conventional demodulation system having a PLL is used, various problems arise, such as the generation of distortion and abnormal noise in the reproduced signal. These undesirable effects are due to causes such as: erroneous locking with respect to higher harmonic components of the direct-wave signal due to the above mentioned tracing distortion; a drop in the level of the angle-modulated wave signal due to interference imparted to the angle-modulated wave signal by the higher harmonic component; and a drop in the level of the reproduced angle-modulated wave signal due to causes such as a deterioration of the tracing ability of the reproducing stylus, and wear of the sound groove of the record disc.

SUMMARY OF THE INVENTION

Accordingly, a general object of the present invention is to provide a novel and useful system for demodulation of angle-modulated wave signals, which overcomes the above described difficulties heretofore accompanying a PLL.

Another and more specific object of the invention is to provide a system for demodulating an angle-modulated wave signal without generating noise, even if unlocking occurs in the PLL, and abnormal noise is generated.

Still another object of the invention is to provide a system using a novel tracking loop for demodulating angle-modulated wave signals.

Other objects and further features of the invention will be apparent from the following detailed description with respect to preferred embodiments of the invention when read in conjunction with the accompanying drawings briefly described below.

BRIEF DESCRIPTION OF THE DRAWINGS

In the drawings:

FIG. 10 is a circuit diagram showing one embodiment of a specific circuit for use in the system shown by the block diagram in FIG. 8.

DETAILED DESCRIPTION

Figure 1:
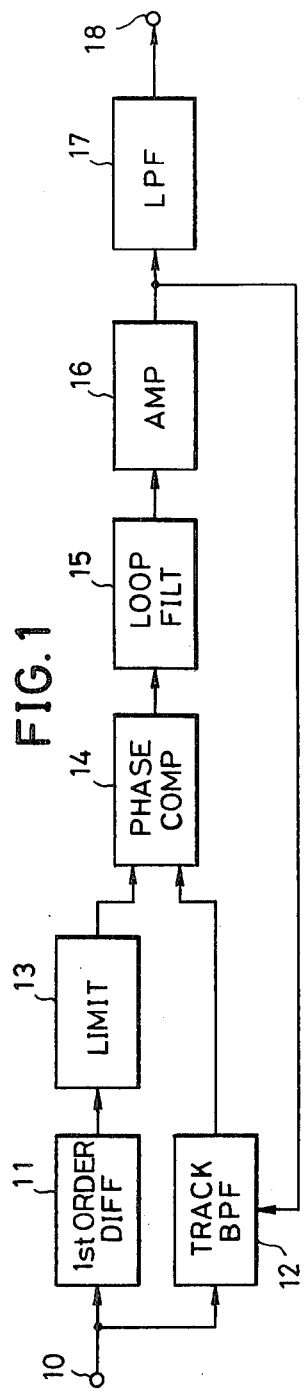
FIG. 1 is a block diagram of a first embodiment of the system for demodulating angle-modulated signals according to the present invention.

In a first embodiment of the invention, an angle-modulated signal is introduced through an input terminal 10 and supplied respectively to a first-order differentiation circuit 11 and a tracking band-pass filter 12. The first-order differentiation circuit 11 exhibits a phase difference characteristic of 90° between input and output, within the frequency band of the angle-modulated wave signal. Accordingly, the output angle-modulated signal of the differentiation circuit 11 is phase shifted by 90° relative to the input angle-modulated signal. Furthermore, the noise component of the output angle-modulated signal, existing in a band lower than the angle-modulated signal band, is thoroughly suppressed by the differentiation circuit 11.

The noise component existing in a band higher than the angle-modulated signal band is, conversely, intensified by the differentiation characteristic. However, the level of the noise component in this high frequency band is very low, in actual practice. There is almost no deleterious effect due to this intensification. The above mentioned noise suppressing effect of the low band is far greater.

The output angle-modulated signal of the differentiation circit 11 is subjected to waveform shaping in an amplitude limiting amplifier 13. It will not exceed a specific level and thereafter is supplied to a phase comparator 14. The signal which has passed through the tracking band-pass filter 12, operating in the manner described hereinafter is also supplied to the phase comparator 14. The phase comparator 14 comprises an analog multiplier of phase detection limit $\pm \pi/2$ rad. and produces as output an error signal of a level in accordance with the phase difference of two input signals.

The carrier component of the output error signal of the phase comparator 14 is removed by a loop filter 15. The resulting error signal is then supplied to an amplifier 16. The output signal of this amplifier 16 is sent, to a low-pass filter 17. There the undesired carrier component is removed. The resulting signal is a demodulated signal appearing at the output terminal 18. The output signal of the amplifier 16 is supplied to the above mentioned tracking band-pass filter 12.

The center pass band frequency of the tracking band-pass filter 12 is variably controlled responsive to a signal from the amplifier 16. Therefore, at the time of tracking, the pass-band center frequency of the tracking band-pass filter 12 automatically follows up the frequency of the angle-modulated signal.

Figure 2:
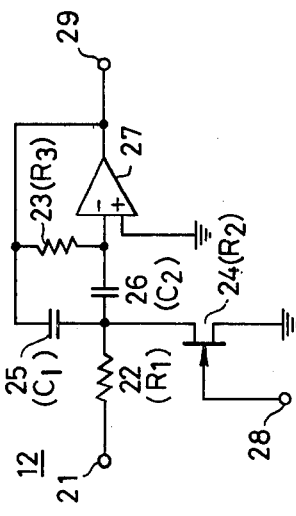
FIG. 2 is a circuit diagram showing one embodiment of a specific circuit of the tracking band-pass filter for use in the system illustrated in FIG. 1.

One embodiment of a circuit of the tracking band-pass filter 12 is illustrated in FIG. 2. An angle-modulated wave signal is introduced through the input terminal 10 and applied to an input terminal 21. A control signal from the amplifier 16 is applied to a terminal 28 which is connected to the gate of a field effect transistor (hereinafter referred to as an "FET") 24. The resistance R2 between the drain and source of the FET 24 is variably controlled responsive to the control signal applied to its gate. Here, the center frequency Fo of the pass band of the tracking band-pass filter 12 can be expressed by the following equation in terms of the resistances R1 and R3 respectively of the resistors 22 and 23 and the capacitances C1 and C2 respectively of the capacitors 25 and 26.

$$Fo = \frac{1}{2\pi} \sqrt{\frac{R1 + R2}{C1\, C2\, R1\, R2\, R3}} \quad (1)$$

Then, if R1 and R2 are selected so that R1 >> R1, the above Eq. (1) becomes as follows.

$$Fo = \frac{1}{2\pi} \sqrt{\frac{1}{C1\, C2\, R2\, R3}} \quad (2)$$

Thus, as a consequence of the variation of the resistance R2 of the FET 24 in response to the control signal applied to the terminal 28, the center frequency Fo of the tracking band-pass filter 12 is variably controlled.

Figure 3:
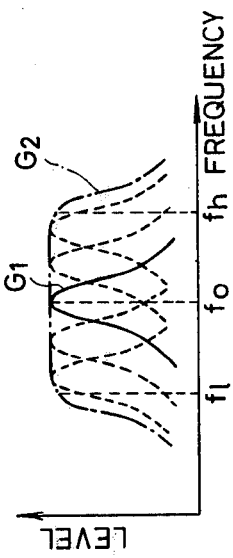
FIG. 3 is a graph indicating the filtering frequency band characteristic of the tracking band-pass filter.

As indicated in FIG. 3, showing the filtering band characteristic of the tracking band-pass filter 12, the center frequency Fo varies as indicated by full lines, and broken lines. The variation is within the range from a lower-limit cut-off frequency fl to an upper-limit cut-off frequency hf. The carrier center frequency fo of the input angle-modulated wave signal is the center frequency. Consequently, the complete tracking loop comprises the tracking band-pass filter 12, the phase comparator 14, the loop filter 15, and the amplifier 16. This tracking loop follows the input angle-modulated wave signal within the range indicated by the single-dot chain line in FIG. 3. The phase comparator 14 carries out a demodulation operation.

Figure 4:
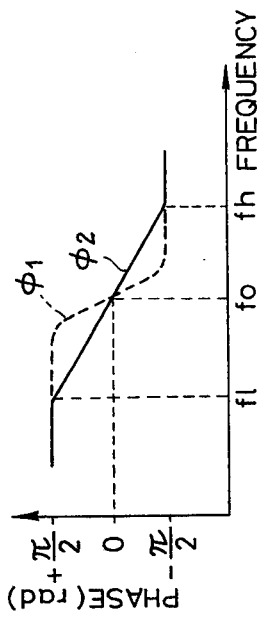
FIG. 4 is a graph indicating the frequency versus phase characteristic of the tracking band-pass filter.

At the time when the tracking band-pass filter 12 is not tracking, the phase characteristic is of a nature indicated by a curve 01 in FIG. 4. It becomes a straight line 02, when the filter 12 is tracking. That is, the characteristic 02 becomes linear between frequencies fl and fh (between phase $+\pi/2$ to $-\pi/2$). Therefore, distortion is not generated in the tracking loop. The angle-modulated wave signal of a frequency deviation from the frequency fl to the frequency fh is demodulated without distortion.

Furthermore, as is also apparent from FIG. 4, the phase deviation of the phase characteristic between the input and output of the tracking band-pass filter 12 is within ± 90° when the carrier center frequency fo of the angle-modulated wave signal is set at 0° (or 180°). Accordingly, even when a phase comparator 14 of ±π/2 rad. is used, the tracking loop follows the phase characteristic 01, also below the frequency fl and above the frequency fh. Therefore, the frequency characteristic of the output error signal voltage of the phase comparator 14 becomes as indicated in FIG. 5.

Figure 5:
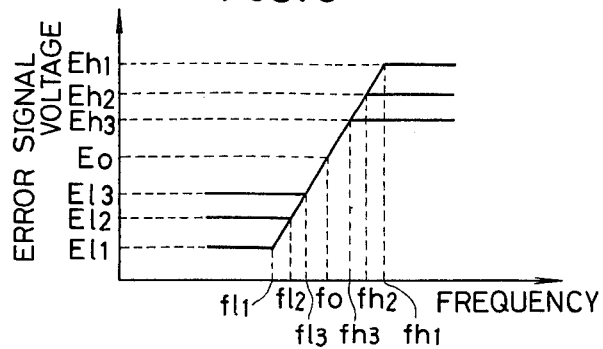
FIG. 5 is a graph indicating the frequency characteristic of output error signal voltage of the phase comparator, for use in the system shown in FIG. 1.

As is apparent from FIG. 5, the PLL of the present invention differs from the conventional PLL. Even when the frequency deviation of the angle-modulated wave signal becomes lower than the frequency fl or higher than the frequency fh, the output error signal voltage does not abruptly become zero. Therefore, abnormal noise is not generated such as is done in a PLL demodulation system. More specifically, band limiting is carried out automatically in accordance with the angle-modulated wave signal input level. The error signal voltage becomes saturated at El2 and Eh2 or El3 and Eh3 with the tracking range in a narrowed range such as that between the frequencies fl2 and fh2 or between the frequencies fl3 and fh3.

If the level of the input angle-modulated wave signal is normal, a characteristic is exhibited wherein the error signal voltage increases linearly between the frequencies fl1 and fh1, and becomes saturated below the frequency fl1 and above the frequency fh1. Therefore, even if there is a carrier drop wherein the angle-modulated wave signal momentarily disappears, abnormal noise will not be generated.

Figure 6:
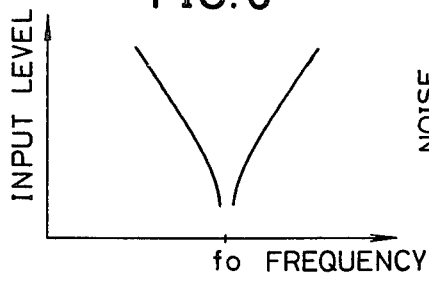
FIG. 6 is a graph indicating the tracking range frequency characteristic relative to input angle-modulated wave signal level.

The loop characteristic of the tracking loop varies in accordance with the level of the angle-modulated wave signal supplied by way of the tracking band-pass filter 12 to the phase comparator 14, and the tracking range also varies. The tracking range frequency characteristic with respect to the level of the input angle-modulated wave signal becomes as indicated in FIG. 6, becoming similar to the lock range characteristic of a conventional PLL.

Figure 7:
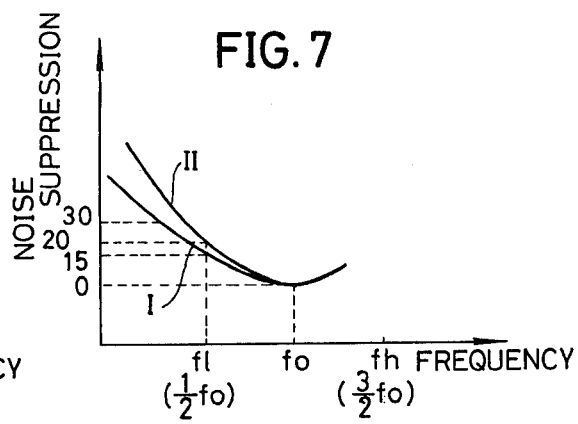
FIG. 7 is a graph indicating the frequency characteristic of noise component suppression quantity.

FIG. 7 shows the frequency characteristic of noise suppression in the system according to the present invention. When frequencies fl and fh are expressed respectively as fl = ½fo and fh = 3/2fo, noise is suppressed by a value in the order of 15 dB, at a frequency in the vincinity of ½fo, as indicated by curve I in FIG. 7.

Figure 8:
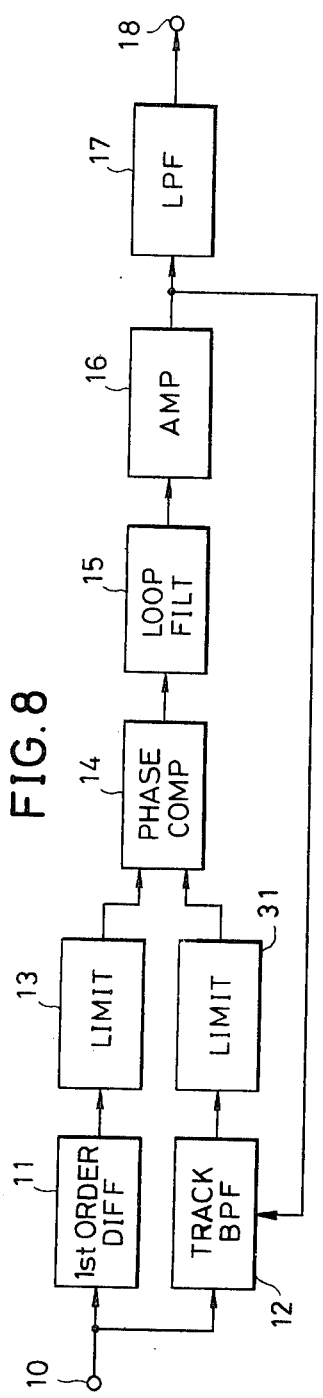
FIG. 8 is a block diagram of a second embodiment of the demodulation system of the invention.

A second embodiment of the invention will now be described with reference to FIG. 8. In FIG. 8, those parts which are the same as corresponding parts in FIG. 1 are designated by like reference numerals, and a detailed description of such parts will be omitted. In the instant embodiment of the invention, a second amplitude limiting amplifier 31 is provided between the tracking band-pass filter 12 and the phase comparator 14.

Figure 9:
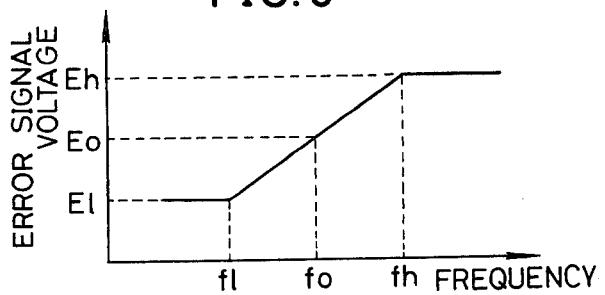
FIG. 9 is a graph indicating the frequency characteristic of an output error signal voltage of the phase comparator in the system illustrated in FIG. 8.

The output signal of the first-order differentiation circuit 11 is limited to a specific level by the first amplitude limiting amplifier 13 and then supplied to the phase comparator 14. The output signal of the tracking band-pass filter 12 is limited to a specific level by the second amplitude limiting amplifier 31 and then supplied to the phase comparator 14. Accordingly, in the instant embodiment, the error signal voltage characteristic does not vary as in the preceding embodiment of the invention, and becomes as indicated in FIG. 9.

FIG. 10 shows one specific embodiment of a demodulation system for use in the circuit of FIG. 8. In this FIG. 10 circuit, an angle-modulated wave signal is introduced through the input terminal 10 and supplied to the differentiation circuit 11 comprising a resistor R16 and a capacitor C15, and to the tracking band-pass filter 12 comprising resistors R11 through R15, capacitors C11, C12, and C13, a FET X, and an amplifier integrated circuit IC 1.

When the internal resistance of the FET X is denoted by r, the center frequency Fo of the tracking band-pass filter 12 is represented as follows:

$$Fo = \frac{1}{2\pi} \sqrt{\frac{(r + R13)R11 + r \cdot R13}{C11 \cdot C12 \cdot R11 \cdot R12 \cdot R13 \cdot r}} \qquad (3)$$

The resistances R14 and R15 and the capacitor C13, connected to the gate of the FET X, apply a level equal to one half the level of the angle-modulated wave signal which is generated between the drain and source of the FET X. This prevents a distortion of the angle-modulated wave signal passing through the tracking band-pass filter 12.

The cut-off frequency Fc of the differentiation circuit 11 is selected so that Fe>4Fo. Furthermore, the phase difference between the input and output of the differentiation circuit 11 is set so that the angle-modulated wave signal will be substantially 90° relative to an unmodulated signal. The output signal of the differentiation circuit 11 passes through the amplitude limiting amplifier 13 comprising resistors R16, R22, an R23, a capacitor C18, and an integrated circuit IC 3 and is supplied by way of a coupling capacitor C20 to the phase comparator 14.

The output signal of the tracking band-pass filter 12 is supplied by way of a coupling capacitor C14 to the amplitude limiting amplifier 31 comprising resistors R17 through R21, capacitors 16 and 17, and an integrated circuit IC 2. The resulting output signal of the amplifier 31 is supplied by way of a coupling capacitor C19 to the phase comparator 14.

The phase comparator 14 comprises a multiplier integrated circuit IC4 for detecting a product. The multiplier comprises resistors R24 through R33, and a capacitor C21. A resistor R34, a constant-voltage diode D, and a capacitor C22 constitute a decoupling circuit.

The output error signal of the phase comparator 14 passes through the loop filter 15 comprising a resistor R35 and a capacitor C23 and is supplied to the amplifier 16 comprising resistors R37 through R40, a capacitor C24, and an integrated circuit IC 5 constituting an amplifier. The resistors R39 and R40 and the capacitor C24 in the amplifier 16 set an AC loop gain in order to obtain the necessary tracking frequency band.

The output error signal of the amplifier 16 is applied to the gate of the FET X of the tracking band-pass filter 12. Furthermore, this output error signal of the amplifier 16 is also a demodulated signal. For this reason, the demodulated signal passes through a coupling capacitor C25 and the low-pass filter 17, which removes the undesired carrier component. The demodulated signal is led out the output terminal 18. A variable resistor R36 sets the center frequency of the filtering band of the tracking band-pass filter 12.

In the instant embodiment, integrated circuits IC3 and IC2 are used in the amplitude limiting amplifiers. However, each of these amplitude limiting amplifiers may also comprise a combination of transistors, diodes, and resistors or some other like combination.

Figure 11:
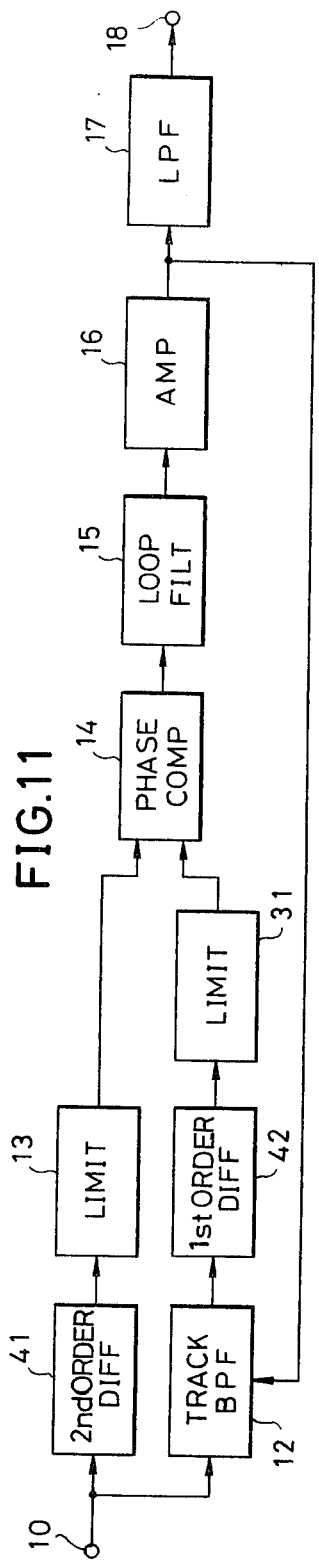
FIG. 11 is a block diagram of a third embodiment of the demodulation system of the invention.

A third embodiment of the invention will now be described with reference to FIG. 11. In FIG. 11, those parts which are the same as corresponding parts in FIGS. 1 and 8 are designated by like reference numerals. Repeated description of such parts will be omitted.

In this demodulation system of the third embodiment of the invention, an angle-modulated wave signal is introduced through the input terminal 10 and supplied to a second-order differentiation circuit 41 and the tracking band-pass filter 12. The second-order differentiation circuit 41 exhibits a phase difference characteristic of 180° between the input and output thereof, with respect to the angle-modulated signal frequency band. The differentiation circuit 41 gives the angle-modulated wave signal a phase difference of 180° relative to the input. The noise component, particularly in the low-frequency range, is greatly reduced as it passes through the amplitude limiting amplifier 13. Then it is supplied to the phase comparator 14.

The output signal of the tracking band-pass filter 12 is supplied to a first-order differentiation circuit 42, which produces a phase difference of 90° relative to the input signal. The noise component in the low-frequency range is reduced. The resulting output signal of the differentiation circuit 42 passes through the amplitude limiting amplifier 31 and is supplied to the phase comparator 14. There is a 90° phase difference respectively between the signals respectively supplied from the amplitude limiting amplifiers 13 and 31 to the phase comparator 14.

The other features of this third embodiment of the demodulation system are the same as those of the preceding embodiments, and therefore description thereof will be omitted.

In accordance with the third embodiment, the noise suppression quantity is as indicated by a curve II in FIG. 7, and the noise at the frequency fl ( = ½fo) is suppressed by approximately 20 dB.

Further, this invention is not limited to these embodiments but variations and modifications may be made without departing from the scope and spirit of the invention.

What is claimed is:

1. A system for demodulating angle-modulated signals comprising:
    tracking band-pass filtering means supplied with an angle-modulated input signal, said filter means having a pass band with a center frequency which is variably controlled by a control signal;
    first amplitude limiting means for limiting the amplitude of the angle-modulated input signal;
    phase-shifting means for establishing a phase difference of 90° between a signal passing through said tracking band-pass filtering means and a signal passing through said amplitude limiting means;
    phase comparing means responsive to the 90° phase difference signals for producing an output error signal in accordance with said phase difference;
    means responsive to said output error signal for controlling said tracking band-pass filtering means; and
    means responsive to said output error signal for deriving a demodulated signal.

2. A demodulating system as claimed in claim 1 in which said phase-shifting means comprises a first-order differentiation circuit in a signal transmission path including said first amplitude limiting means.

3. A demodulating system as claimed in claim 1 in which said phase comparing means comprises an analog multiplier having a phase comparison range between $+\pi/2$ rad. and $-\pi/2$ rad.

4. A demodulating system as claimed in claim 1 in which said center frequency of said pass band of said tracking band-pass filtering means is varied within a specific frequency range between frequencies fl and fh (where fl<fo<fh) with a center frequency fo equal to a carrier frequency of the angle-modulated wave signal.

5. A demodulating system as claimed in claim 4 in which said tracking band-pass filtering means has a phase characteristic of $+\pi/2$ rad. below the frequency fl, a linear slope from $+\pi/2$ rad. to $-\pi/2$ rad. between the frequency fl and fh, and $-\pi/2$ rad. above the frequency fh.

6. A demodulating system as claimed in claim 1 which further comprises second amplitude limiting means in a signal transmission path including said tracking band-pass filtering means and extending to said phase comparing means.

7. A system for demodulating angle-modulated signals comprising:
    first-order differentiation means supplied with an angle-modulated signal;
    first amplitude limiting means for limiting the amplitude of the output signal of said first-order differentiation means;
    tracking band-pass filtering means responsive to said angle-modulated signal and having a pass band with a center frequency which is controlled responsive to a control signal;
    second amplitude limiting means for limiting the amplitude of the output signal of said tracking band-pass filtering means;
    phase comparing means responsive to the output signals of said first and second amplitude limiting means for producing an error signal in accordance with the phase difference between said output signals;
    means responsive to said error signal of said phase comparing means for controlling said tracking band-pass filtering means; and
    means responsive to said error signal for deriving a demodulated signal.

8. A demodulating system as claimed in claim 1 in which said phase-shifting means comprises a second-order differentiation circuit in a signal transmission path including said first amplitude limiting means and a first-order differentiation circuit in a signal transmission path including said tracking band-pass filtering means.

9. A system for demodulating angle-modulated wave signals comprising:
    second-order differentiation means supplied with an angle-modulated signal;
    first amplitude limiting means for limiting the amplitude of the output signal of said second-order differentiation means;
    tracking band-pass filtering means responsive to said angle-modulated wave signal and having a pass band with a center frequency which is controlled by a control signal;
    first-order differentiation means responsive to the output of said tracking band-pass filtering means;
    second amplitude limiting means for limiting the amplitude of the output signal of said first-order differentiation means;
    phase comparing means responsive to the outputs of said first and second amplitude limiting means for producing an error signal in accordance with the phase difference between the output signals of said first and second amplitude limiting means;
    means responsive to said error signal for controlling said tracking band-pass filtering means; and
    means responsvie to said error signal for deriving a demodulated signal.

* * * * *